(12) United States Patent
Farahi et al.

(10) Patent No.: US 7,067,240 B2
(45) Date of Patent: Jun. 27, 2006

(54) GRAY SCALE FABRICATION METHOD USING A SPIN-ON GLASS MATERIAL AND INTEGRATED OPTICAL DESIGNS PRODUCED THEREFROM

(75) Inventors: Faramarz Farahi, Charlotte, NC (US); Patrick Moyer, Charlotte, NC (US); Ramazan Benrashid, Charlotte, NC (US); Pascal Dupriez, Charlotte, NC (US)

(73) Assignee: Waveguide Solutions, Inc., Charlotte, NC (US)

( * ) Notice: Subject to any disclaimer, the term of this patent is extended or adjusted under 35 U.S.C. 154(b) by 93 days.

(21) Appl. No.: 10/436,532

(22) Filed: May 14, 2003

(65) Prior Publication Data
US 2003/0203315 A1  Oct. 30, 2003

Related U.S. Application Data

(63) Continuation-in-part of application No. 09/803,342, filed on Mar. 9, 2001.

(60) Provisional application No. 60/379,809, filed on May 13, 2003.

(51) Int. Cl.
*G03C 5/00* (2006.01)

(52) U.S. Cl. .................. 430/322; 430/321; 430/330; 430/296; 385/8

(58) Field of Classification Search ................ 430/321, 430/322, 323, 330, 296; 385/8, 14, 37
See application file for complete search history.

(56) References Cited

U.S. PATENT DOCUMENTS

2002/0172894 A1 * 11/2002 Fallahi et al. ............... 430/321

* cited by examiner

*Primary Examiner*—John A. McPherson
*Assistant Examiner*—Daborah Chacko-Davis
(74) *Attorney, Agent, or Firm*—Andrew F. Sayko, Jr.

(57) ABSTRACT

The subject invention relates to the fabrication of micro-optical structures in a glass-like transparent material using conventional photolithography processing steps. The glass-like material is a spin-on glass (SOG) material, which behaves like a negative-tone photoresist, and has high quality optical properties similar to those of glass. The present invention can take advantage of gray scale photomasks to illuminate the uncured spin-on material with various illumination intensities, thus resulting in variations in resultant film thickness of the SOG material after the chemical development step. This results in micro-optical structures that can be fabricated with the desired shapes, depending on the transmission characteristics of each region of the gray scale photomask.

15 Claims, 9 Drawing Sheets

GRAY SCALE FABRICATION METHOD USING A SPIN-ON GLASS MATERIAL AND INTEGRATED OPTICAL DESIGNS PRODUCED THEREFROM

CROSS-REFERENCE TO RELATED APPLICATIONS

This application claims the benefit of priority under 35 U.S.C. 119(c) to U.S. Provisional Application 60/379,809 filed May 13, 2003. This application also claims priority under 35 U.S.C. 120 and is a continuation-in-part of U.S. application Ser. No. 09/803,342.

FIELD OF THE INVENTION

The invention relates to a process for fabricating micro-optical elements, and to integrated optical circuit fabrication. Integrated optical circuits are also known as planar lightwave circuits (PLC).

BACKGROUND OF THE INVENTION

Micro optoelectronic elements have become of great importance in optoelectronic interconnection technologies, and the development of communications and control systems. Diffractive optical elements such as spherical, cylindrical, Fresnel lenses, aspherics and other micro-optical devices having rather precise three-dimensional profiles or contours present certain problems during mass production because of problems with product quality. In addition, the fabrication of large arrays of such optical elements covering large areas is almost always very costly.

Most chip-scale integrated optical elements, components, and functionalities are based upon waveguides that are implemented with a binary height structure. These include lenses that are microfabricated using conventional microfabrication techniques. For example, arrayed waveguide gratings (AWG) take advantage of a combination of single mode waveguides and planar multimode (or lens) regions to result in multiplexing/demultiplexing (mux/demux) functionality. In addition, micro-optical elements, such as Fresnel lenses (diffractive lenses) are often fabricated with a binary height structure. However, it is much more beneficial to the efficiency and beam quality of the lens to be able to fabricate a Fresnel lens with varying height across each zone region, or to be able to fabricate a traditional refractive lens by controlling the height of the lens with a parabolic geometry. This varying height of the feature is often referred to as gray scale fabrication.

The use of a gray scale mask fabrication process for producing large quantities or large arrays of micro-optical elements requiring high resolution of three-dimensional contours has several advantages. Gray scale masks having the desired gray scale pattern normally require only a single exposure of a photoresist when fabricating the micro-optical elements on a substrate, using an etching process. The use of gray scale masks avoids the alignment errors the frequently result from a process that requires the use of multiple binary masks. In addition, if a suitable gray scale patterned mask material is provided, thermal expansion and contraction of the masks can be substantially avoided.

A survey of prior art on using gray scale masks producing micro-optical elements shows a common dependence on the use of a photoresist layer in the fabrication of such gray scale optical structures. U.S. Pat. No. 6,071,652 and 6,420,073, and U.S. patent application Ser. No. 20020146627A1 disclose a process by which the illumination of a gray scale patterned photomask transfers the gray scale patterns into a layer of photoresist that has been deposited onto a transparent material. The pattern in the photoresist is then transferred to the transparent material into which the optical element is fabricated. The transparent material in question may be a transparent substrate or a transparent material deposited onto the substrate.

The above-discussed patents also disclose forming a micro-optical structure using gray scale technology, wherein the three-dimensionality of the structure is provided via repeated layering and development of these layers using multiple binary masks. This type of process, however, has several disadvantages. In order to fabricate, for example, curved structures using this process, many very thin layers and many different patterned binary photomasks would be necessary in order to simulate a reasonably curved structure. In addition, if relatively few layers and photomasks are utilized, the quality of the simulation of the curve would be poor due to large vertical step sizes. The former would make the fabrication process extremely slow, labor intensive, expensive, and conducive to large misalignment errors, while for the latter, in the case of a microlens for example, the lensing efficiency would be dramatically decreased.

Another technique for forming a refractive micro-optical element includes forming a structure in a photoresist by patterning and melting a photoresist layer on a glass substrate. The melting of the photoresist generates spherical surfaces. This technique is limited to special shapes and can only provide spherical contours using a thin positive photoresist layer. The refractive element is produced by ion milling the photoresist structure and then the glass substrate. The ions first mill the photoresist and, after the photoresist is removed in a region, the glass substrate is milled. In this manner the photoresist structure is transferred to the glass substrate and the refractive micro-optical element is formed.

In U.S. Pat. No. 6,301,051, a process is disclosed wherein a planarized material is deposited onto an opto-electronic device substrate and the material is coated with a layer of a photoresist. Using a gray scale patterned photomask, a thickness contour matching the photomask gray scale is then patterned into the photoresist photolithographically. The contour pattern is then transferred to the planarized material by ion etching.

The prior art processes previously discussed have in common the required inclusion of a photoresist in the fabrication process. Among the characteristics that differentiate the present method of fabricating a micro-optical element from the prior art processes is that, in the subject method, the negative photosensitivity of the material in which the micro-optical elements are fabricated allows the exclusion of the photoresist material from the process. The claimed method using a spin-on glass material (a sol-gel) and allows the gray scale fabrication of a glass-like material (a spin-on glass material or SOG material) having added vertical functionality and design possibilities because the structures can be planarized with varying heights (as desired) after each coating (preferably spin-coating) layer.

SUMMARY OF THE INVENTION

The present invention relates to a method of fabricating a micro-optical element, which method comprises: (1) depositing on the surface of a suitable transparent substrate (such as a glass, silicate glass, or Germanium substrate), at a process temperature of less than 225° C., a coating consisting essentially of a spin-on glass material, wherein the spin-on glass material is directly patternable as a negative photoresist (A particularly preferred SOG material is disclosed in copending U.S. application Ser. No. 09/803,342, filed on Mar. 9, 2001.); (2) providing a gray scale mask, having a desired gray scale pattern, between an illumination source and the coated substrate of step (1); (3) exposing the coated substrate of step (1) to illumination through the gray scale mask of step (2) and thereby forming a negative image of the desired pattern on the coated substrate; and (4) developing the desired image on the coated substrate by dissolving away the unexposed portions of the spin-on glass coating. The illumination source is typically the desired wavelength of ultraviolet light, a laser beam or an electron beam. The development step is then normally followed by one or more thermal curing steps, normally in an oven, and an etching step whereby the desired pattern is formed on the transparent substrate. The resulting micro-optical structure preferably has a thickness between 0.1 micrometers and 100 micrometers.

DETAILED DESCRIPTION OF THE INVENTION

The preferred embodiments of the present invention utilize a hybrid glass/polymer sol-gel material, i.e., a spin-on-glass (SOG) material. The invention is not limited to a particular SOG material, but it requires a SOG material that can utilize a low process temperature (<225° C.), ease and low cost of fabrication, the ability to be integrated into traditional semiconductor processes, and a level of integration that provides the advantages of the present invention. An example of such a hybrid Sol-Gel material is described in a paper by Fardad et al. (M. Amir Fardad, Oleg V. Mishechkin, and Mahmoud Fallahi, "Hybrid Sol-Gel Materials for Integration of Optoelectronic Components", Journal of Lightwave Technology, Vol. 19, No. 1, January 2001). Details of the fabrication of the material and the process conditions can be found in this application, which is incorporated herein by reference.

The subject invention involves a process whereby a SOG structure consisting of a micro-optical element can be fabricated with varying desired heights using a single fabrication process, which comprises coating the SOG material onto a suitable transparent substrate, illumination (exposure) of the coated structure through a gray scale mask having a desired pattern, development of the exposed patterned structure and, preferably, one or more final thermal curing steps and an etching step. The SOG material behaves as a negative photoresist in that upon exposure to light, such as ultraviolet (UV) radiation, the material cures such that the exposed portions are resistant to solvent removal (development). In the regions where the material is not exposed to illumination, the material is not chemically cross-linked and the material is not resistant to solvent removal, i.e., the material washes away when treated with a suitable solvent. By mixing a photoinitiator into the SOG material before starting the fabrication process, the SOG material can be fabricated to result in a tapered three-dimensional (3-D) structure when using a gray-scale mask during exposure to illumination. The UV curing can be done at 365 nm or 254 nm using appropriate initiators. For 365 nm UV exposure, Lucerin OT or other initiators sensitive to 365 nm can be used. Initiators sensitive to deep UV such as Irgacure 284 and Irgacure 819, dimethylbezin, benzoylbiphenyl, at 1–10% can be used for 254 nm curing.

Gray scale illumination means that the gray scale mask transmits the desired pattern because it is neither totally opaque nor totally transparent; but rather, the mask is partially transparent. The degree of transparency in each region of the mask is a measure of the resultant height of the micro-optical structure on the substrate exposed through each such region.

The micro-optical element that results from the subject method will provide significant benefits, e.g.: (i) micro-lens efficiency, (ii) mode coupling between waveguides and from fiber to waveguide, (iii) control of surface roughness, (iv) packaging issues (stand-off and dielectric buffer structures), (v) control of fluid flow and thermal management in micro-fluidic devices, and (vi) polarization control management in waveguides. These are just examples of how this technology may benefit the current functionality of micro-optical elements.

Optical density (OD) is defined as:

$$T=10^{-OD} \qquad \text{Equation 1}$$

or $$OD=-\log(T) \qquad \text{Equation 2}$$

where T is the fractional power transmitted through the mask and log is the base ten logarithm. For example, if the gray scale mask transmits half of the light, the OD of the mask at that point is:

$$OD=-\log(0.5)=0.301 \qquad \text{Equation 3}$$

Figure 1:
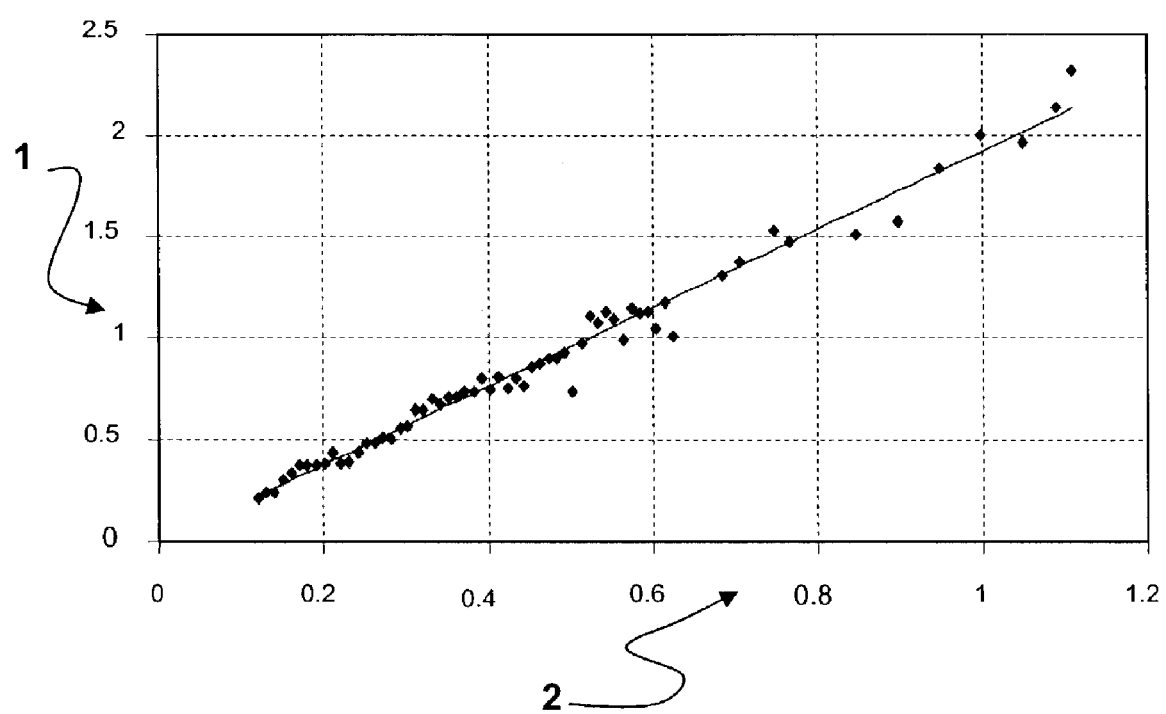
FIG. 1 is a graph showing the thickness of the SOG material etched for a given optical density of the gray scale mask. The vertical axis (1) is the thickness of the etched layer in micrometers, and the horizontal scale (2) is the optical density of the mask used. This particular graph is unique to a specific set of film thicknesses and process parameters. Some of the process parameters that can be varied to control the slope of the curve shown in FIG. 1 are: ultraviolet illumination intensity, illumination time, concentration of the photoinitiator in the sol-gel, prebake time, and prebake temperature.

Of interest in the diagram of FIG. 1 is the fact that the amount of SOG material removed (etched) after the gray scale illumination and development increases as a function of mask OD. In other words, the higher OD results in lower light transmission, and, hence, less material curing. Thus, when immersed into the chemical solvent for developing, the less cured material is removed more efficiently, thus resulting in a micro-optical element having the desired gray scale structure.

Figure 2:
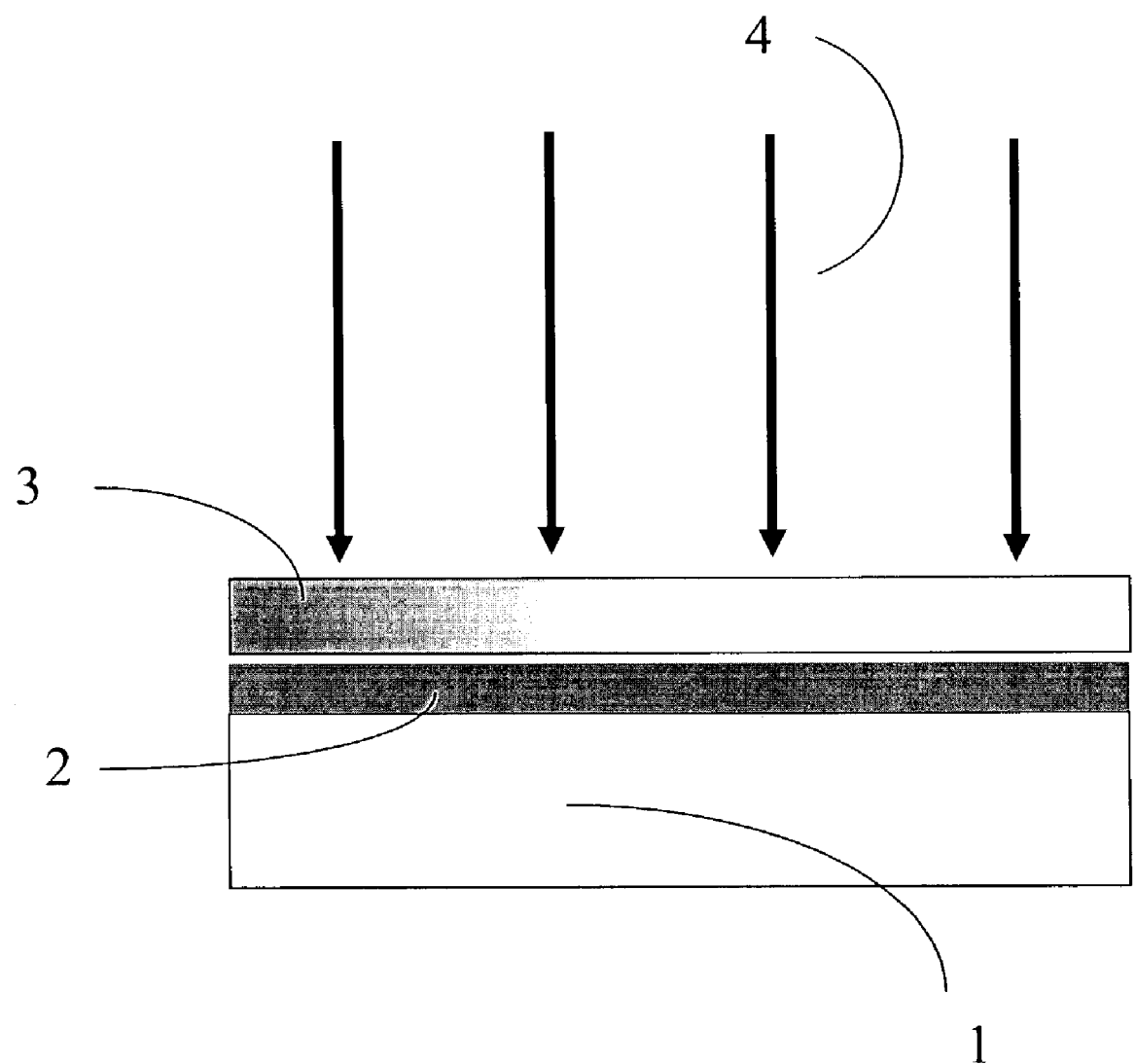

FIG. 2 depicts the process of printing patterns using gray scale mask. It starts by a substrate (1) onto which spin-on glass (2) is applied. By controlling the pattern of gray scale on the mask (3), the above mentioned rate of material removal during the chemical solvent development step can then be used to advantage to create controlled features. The gray scale mask in the diagram ranges from total transparency (white region on the right) to total opacity (dark region to the left) with respect to the ultra violet exposure beam (4).

Figure 3:
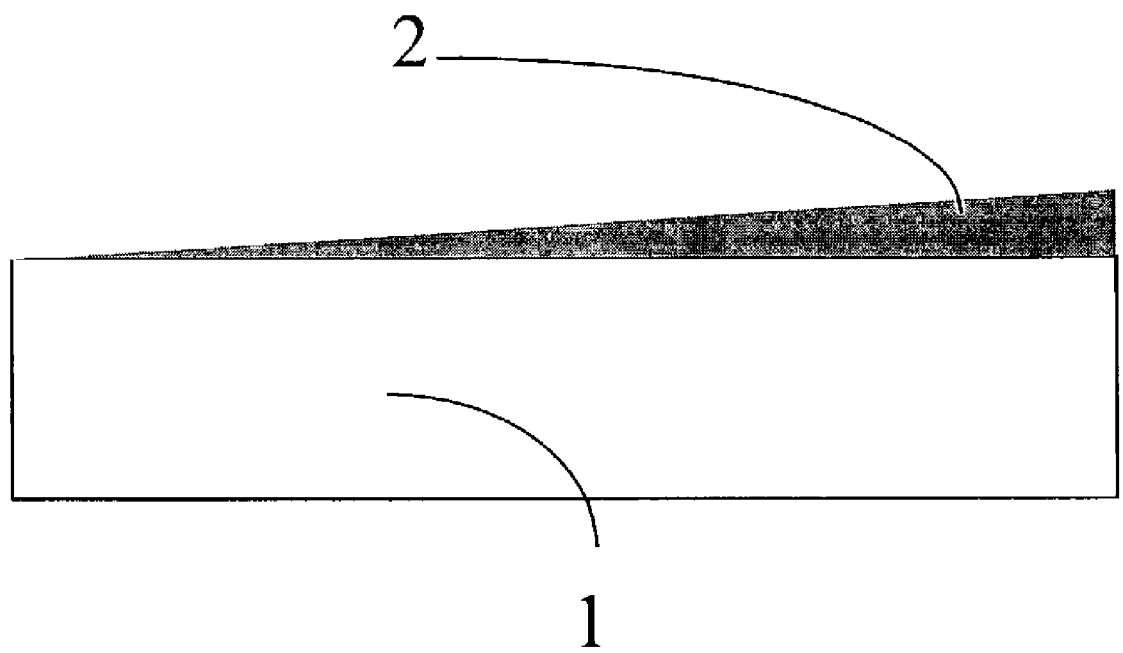

FIG. 3 shows substrate (1) and the resulting SOG material (2), after illumination and development, with the tapered structure corresponding to the optical density of the mask used in FIG. 2 above.

Applications of this technology include, but are not limited to, the fabrication of: Fresnel lens, tapered waveguide structures for mode coupling applications, refractive lenses, shaped dielectric stand-off layers for packaging, and various non-rectangular waveguides. Included in the definition of non-rectangular waveguides are circular waveguides, which would be optimal for coupling to optical fibers, as well as reducing polarization dependent effects (i.e., dispersion and loss).

FIGS. 4–9 illustrate the general process envisioned for patterning a circular waveguide structure using the subject gray scale method. This enables the fabrication of a circular waveguide in an integrated optical design. This design can be optimized to perfectly match the mode structure of a single mode fiber. This all but eliminates mode matching and polarization dependent losses inherent to integrated optical components.

Figure 4:
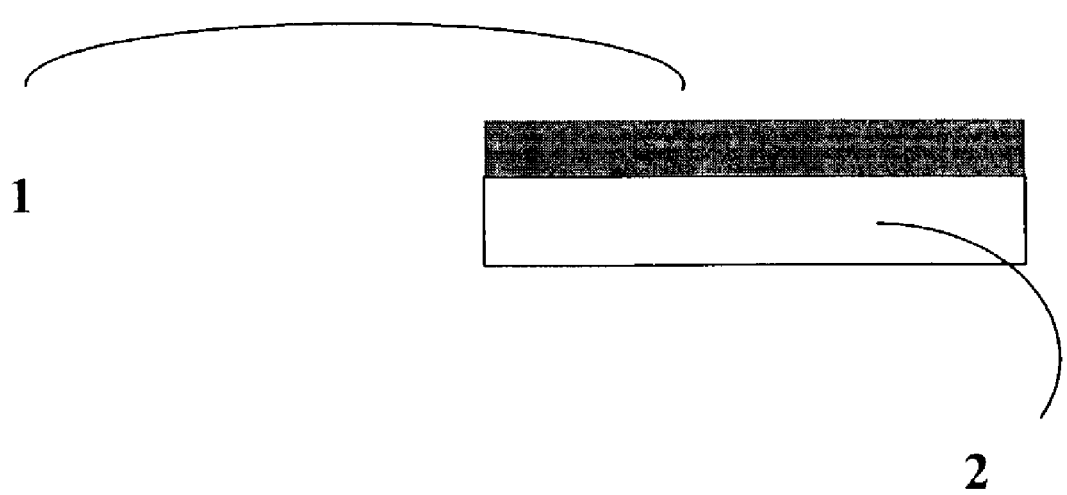

FIG. 4 shows the process begining with the spin coating of a cladding buffer layer (1) of approximately 6 microns (micrometers) thickness onto the substrate (2). This cladding buffer layer is then fully cured.

Figure 5:
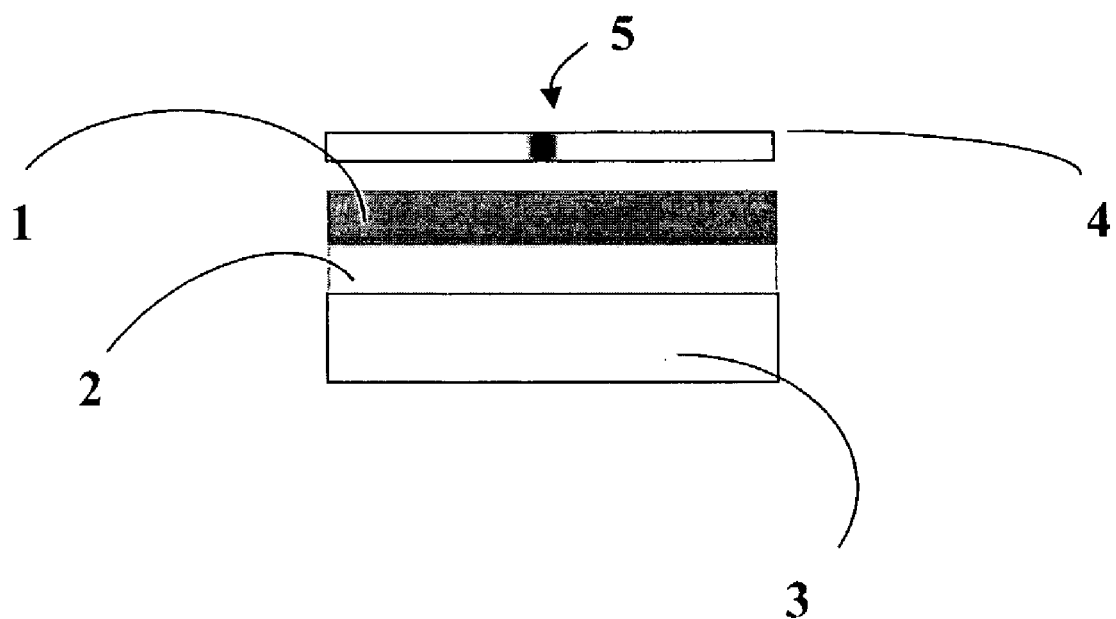

FIG. 5 shows another cladding layer (1), of thickness equal to the radius of the desired circular waveguide, is then spin coated onto the first layer (2) on the substrate (3). This second layer is then UV cured using the mask shown (4). The mask is completely transparent except for the gray scale necessary to cure the semicircular pit structure (5).

Figure 6:
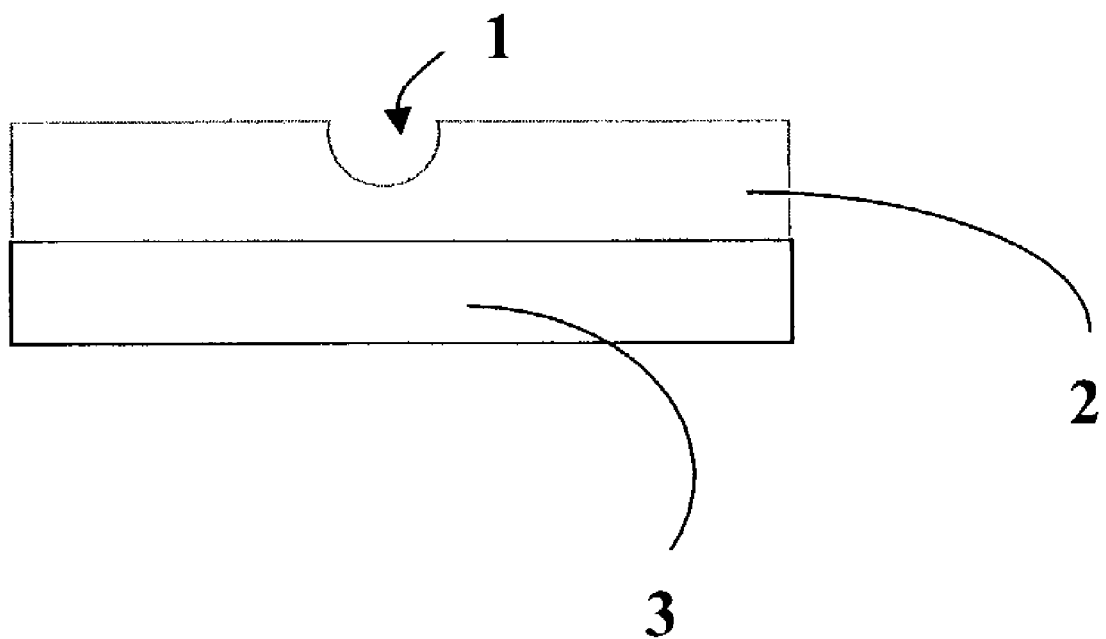

FIG. 6 shows the semicircular pit structure (1) patterned in the SOG layer (2) on the substrate (3).

Figure 7:
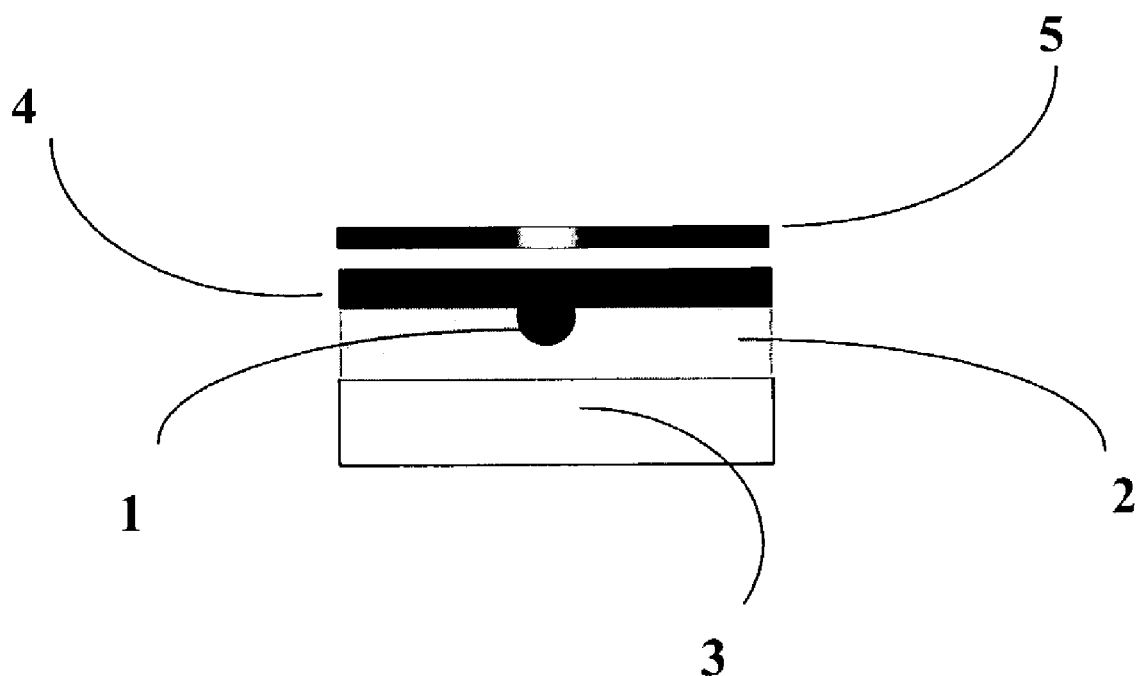

FIG. 7 depicts this semicircular structure (1) in the cladding SOG layer (2) on substrate (3), which is then coated with the waveguide core layer (4), of thickness equal to the diameter of the core Waveguide, approximately 8 micrometers. Another gray scale mask (5) is used for the UV illumination in order to define the desired dimensions of the waveguide core.

Figure 8:
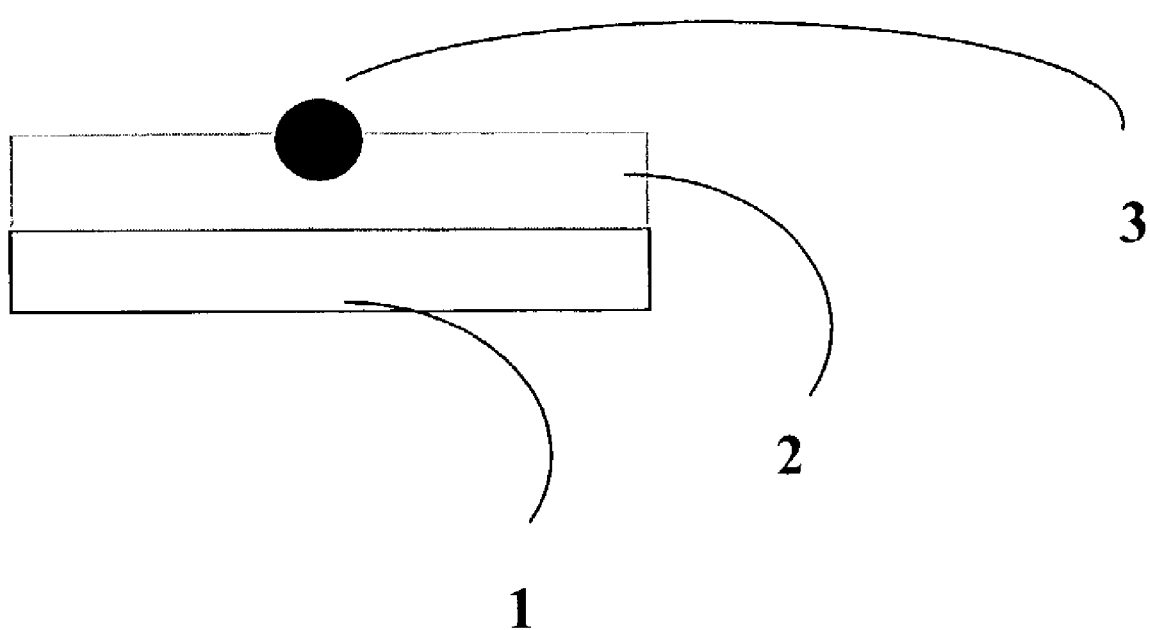

FIG. 8 shows the substrate (1) with the cladding layer (2) and the circular core structure (3) having developed the SOG film after the UV exposure step described in FIG. 7.

Figure 9:
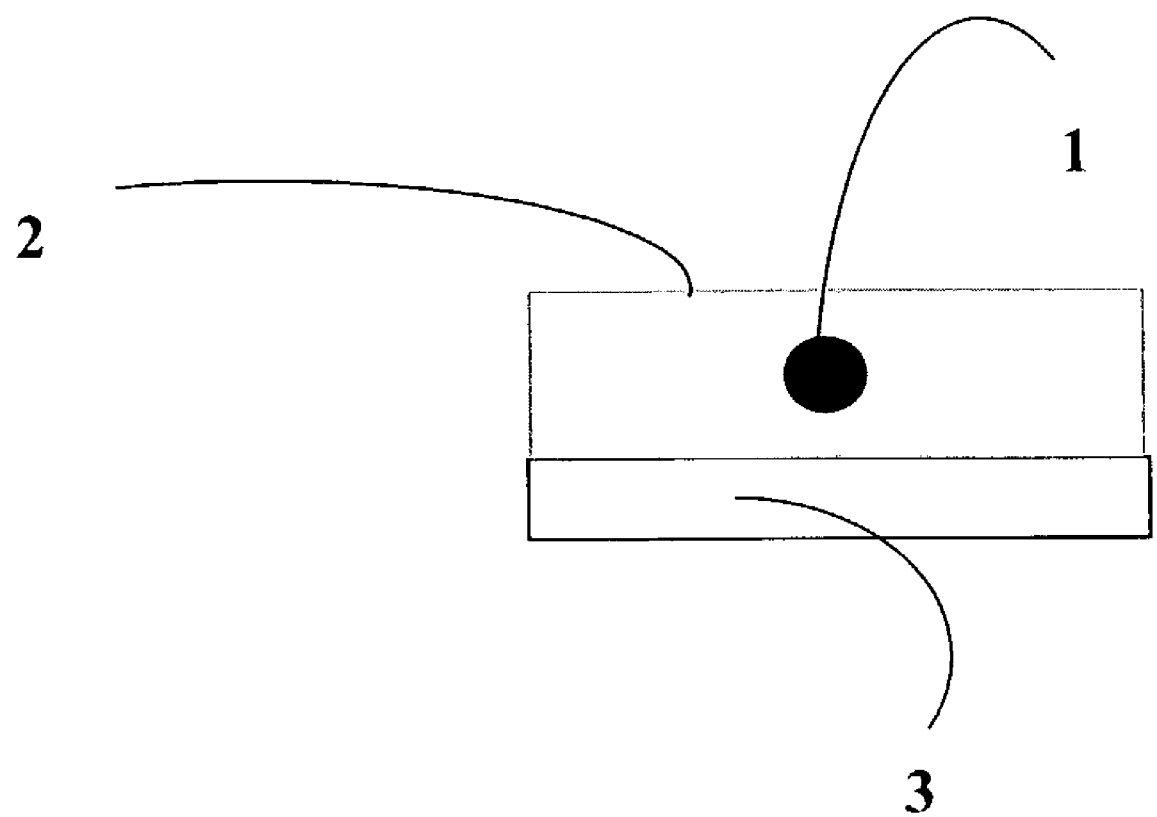

FIG. 9 depicts the final resulting circular core structure (1) buried within the cladding layer (2) after a top protective SOG layer is spin coated and cured on the structures on substrate (3) as described in FIG. 8 above.

The invention claimed is:

1. A process for fabricating a micro-optical element which method comprises: (1) depositing on the surface of a suitable transparent substrate a coating consisting essentially of a spin-on glass material, at a process temperature of less than 225° C., wherein the spin-on glass material is directly patternable as a negative photoresist; (2) providing a gray scale mask, having a desired gray scale pattern, between an illumination source and the coated substrate of step (1); (3) exposing the coated substrate of step (1) to illumination through the gray scale mask of step (2) and thereby forming a negative image of the desired pattern on the coated substrate; and (4) developing the desired image on the coated substrate by dissolving away the unexposed portions of spin-on glass coating.

2. The process of claim 1, wherein the spin-on glass material of step (1) contains a photoinitiator.

3. The process of claim 1, wherein the illumination source is ultraviolet light, a laser beam or an electron beam.

4. The process of claim 1, wherein the substrate comprises a glass, silicate glass, or Germanium substrate.

5. The process of claim 1 further comprising one or more thermal curing steps after step (4).

6. The process of claim 5 further comprising an etching step, after the one or more thermal curing steps, and thereby forming the desired pattern on the transparent substrate.

7. The process of claim 1 wherein the resulting micro-optical element has a thickness between 0.1 micrometer and 100 micrometers.

8. The process of claim 1, wherein the resulting micro-optical element is an optical refractive lens.

9. The process of claim 1, wherein the resulting micro-optical element is an optical diffractive lens.

10. The process of claim 1, wherein the resulting micro-optical element is a tapered waveguide.

11. The process of claim 10, wherein the waveguide is suitable for use in a planar lightwave circuit.

12. The process of claim 10, wherein the waveguide is suitable for use in a mode converter for efficiently coupling light from an optical fiber into a smaller planar lightwave circuit.

13. The process of claim 8, wherein the waveguide is suitable for use in a mode converter for efficiently coupling light from a smaller planar lightwave circuit into an optical fiber.

14. The process of claim 1, wherein the micro-optical element is a mechanical standoff for providing a specific controlled separation between two substrates.

15. The process of claim 10, wherein the micro-optical element is an optical beam splitter, mirror, or other micro-optical component.

* * * * *

UNITED STATES PATENT AND TRADEMARK OFFICE
CERTIFICATE OF CORRECTION

PATENT NO. : 7,067,240 B2  Page 1 of 1
APPLICATION NO. : 10/436532
DATED : June 27, 2006
INVENTOR(S) : Faramarz Farahi et al.

It is certified that error appears in the above-identified patent and that said Letters Patent is hereby corrected as shown below:

On the Title Page

Under Related U.S. Application Data at Item (60):

Delete the priority claim of "Provisional application No. 60/379,809, filed on May 13, 2003"

In Column 1, Line 10:

Delete the priority claim of "Provisional application No. 60/379,809, filed on May 13, 2003"

Signed and Sealed this
Twenty-ninth Day of November, 2011

David J. Kappos
*Director of the United States Patent and Trademark Office*